(12) United States Patent
Lau et al.

(10) Patent No.: US 7,011,804 B2
(45) Date of Patent: Mar. 14, 2006

(54) METHOD AND APPARATUS FOR PREPARING ALUMINUM NITRIDE

(75) Inventors: Chung-Hong Lau, Tainan (TW);
Chen-Hsin Lai, Tainan (TW);
Chih-Hsing Tsao, Tainan (TW);
Tsang-Tien Wang, Tainan (TW);
Tzyy-Bin Werng, Tainan (TW)

(73) Assignee: Taiwan Salt Company, Tainan (TW)

( * ) Notice: Subject to any disclaimer, the term of this patent is extended or adjusted under 35 U.S.C. 154(b) by 340 days.

(21) Appl. No.: 10/612,530

(22) Filed: Jul. 2, 2003

(65) Prior Publication Data

US 2005/0002846 A1    Jan. 6, 2005

(51) Int. Cl.
*C01B 21/072*    (2006.01)

(52) U.S. Cl. .................................. 423/412
(58) Field of Classification Search ............... 423/412
See application file for complete search history.

(56) References Cited

U.S. PATENT DOCUMENTS

| 4,877,759 | A | * | 10/1989 | Holt et al. ................. | 501/98.4 |
| 5,460,794 | A | * | 10/1995 | Chung et al. ............... | 423/412 |
| 5,693,305 | A | * | 12/1997 | Revankar et al. ........... | 423/412 |
| 5,846,508 | A | * | 12/1998 | Chung et al. ............... | 423/412 |
| 6,423,287 | B1 | * | 7/2002 | Chung et al. ............... | 423/412 |
| 6,482,384 | B1 | * | 11/2002 | Chung et al. ............... | 423/412 |
| 2003/0185740 | A1 | * | 10/2003 | Chung et al. ............... | 423/412 |

FOREIGN PATENT DOCUMENTS

JP    63-274605    11/1988

OTHER PUBLICATIONS

"Preparation of Mixed Ultrafine (Al+AlN) Powders and Their Nitridation" by Uda et al; Physical Chemistry of Powder Metals Production; The Minerals, Metals & Materials Society (1989), no month.

"Combustion Synthesis Using Microwave Energy" by Clark et al; Ceram. Eng. Sci Proc. 11[9-10], pp. 1729-1742 (1990), no month.

"New Ceramic Processing Approaches Using Combustion Synthesis Under Gas Pressure" by Miyamoto; Ceramic Bulletin, vol. 69, No. 4, pp. 686-690 (1990), no month.

(Continued)

*Primary Examiner*—Wayne A. Langel
(74) *Attorney, Agent, or Firm*—Knobbe Martens Olson & Bear LLP

(57) ABSTRACT

A method and an apparatus for preparing aluminum nitride are disclosed. The method for preparing aluminum nitride is first to prepare a reactant-containing body filled with admixtures of aluminum powder, a diluent (aluminum nitride powder) and nitrogen-containing solid compound, the reactant-containing body having an ignition portion, a propagating portion, a sustaining portion and an ending portion. Thereafter, the reactant-containing body is placed on a base having through holes in a reaction chamber, and preheated to a predetermined temperature for a predetermined period of time. Then, a re-circulating nitrogen gas is introduced through the reactant-containing body, and coolant is re-circulated between an inner wall and an outer wall of the reaction chamber, and then the ignition portion is ignited to perform a combustion synthesis process, thereby preparing the aluminum nitride, thereby preparing the aluminum nitride. The apparatus for preparing aluminum nitride comprises a reaction chamber having an inner wall and an outer wall, wherein a coolant is re-circulated between the inner wall and the outer wall; a preheating device; a nitrogen re-circulation system; and an igniting device.

23 Claims, 8 Drawing Sheets

OTHER PUBLICATIONS

"Aluminum Nitride, a Refractory for Aluminum for 2000" by Long et al; Journal of American Ceramic Society, vol. 42, No. 2, pp. 53-59 (Feb. 1, 1959).

"Comprehensive Treatise On Inorganic and Theoretical Chemistry" by Mellor; vol. VIII, Nitrogrn and Phosphorus. Longmans, Green and Co., New York, pp. 111-112 (1928), no month.

* cited by examiner

METHOD AND APPARATUS FOR PREPARING ALUMINUM NITRIDE

FIELD OF THE INVENTION

The present invention relates to a method and an apparatus for preparing aluminum nitride, and more particularly, to a method and an apparatus for effectively preparing loosened aluminum nitride by combustion synthesis reaction.

BACKGROUND OF THE INVENTION

Recently, aluminum nitride (AlN) has become a very important material in industrial applications due to its unique physical properties, such as high thermal conductivity close to that of metals and more than 10 times as much as that of alumina; high electrical resistivity and low thermal expansion coefficient comparable to silicon and silicon carbide; a high electrical resistivity; good thermal-shock resistance; mechanical strength comparable to alumina ceramics; and good corrosion resistance. Aluminum nitride has been popularly considered for use in many commercial applications, such as substrates for electronic components; integrated circuit packaging materials; heat dissipation materials; and vessels for containing or processing molten metals and salts.

Aluminum nitride are generally manufactured via the method of, carbothermally reducing and nitriding alumina; directly reacting aluminum metal with nitrogen; reacting aluminum chloride and ammonia in a vapor phase; and self-propagating high temperature synthesis (SHS), i.e. combustion synthesis. The first three methods mentioned above and their modified processes all have the common drawbacks of taking relatively much time; consuming relatively much energy; having relatively low conversion rate, etc. In comparison with those methods, the method of combustion synthesis is newly developed to produce aluminum nitride, and has the advantages including fast reaction rate; less energy consumption; simple manufacturing steps suitable for use in mass production; and higher conversion rate. The method of combustion synthesis basically uses a spontaneous chemical reaction initiated by igniting and rapidly propagating a combustion wave through a reactant admixture to produce aluminum nitride. The factors of successfully producing aluminum nitride by combustion synthesis include providing sufficient nitrogen fully penetrating the reactant admixture; preventing agglomeration of aluminum nitride produced, thus benefiting the subsequent grinding process; and achieving a complete reaction. Additionally, controlling the temperature of nitrogen gas; recycling the nitrogen gas; and cooling the reaction chamber wall will further enhance the quality and productivity of preparing aluminum nitride; prolong the life of reaction chamber; and reduce the production cost.

Several prior arts for preparing aluminum nitride by the combustion synthesis method are described hereinafter:

(1) In Japan Patent No. 63-274605, aluminum powder and sodium nitride ($NaN_3$) powder or, such as potassium nitride ($KN_3$), barium nitride ($Ba_3 N_2$), etc., are well mixed in accordance with an appropriate ratio, and thereafter the mixture is placed in a refractory container. After an igniting agent is placed on the mixture, the refractory container is placed into an electric oven that will be filled with nitrogen gas at a pressure less than or equal to 10 $kg/cm^2$. The reactants are preheated in the electric oven, and then ignited by an electric wire to perform the combustion reaction so as to form an aluminum nitride powder.

(2) Uda et al. ("Preparation of Mixed Ultrafine (Al+AlN) Powders and Their Nitridation", Physical Chemistry of Powder Metals Production and Processing, The Minerals, Metals & Materials Society, 1989.) disclosed the preparation of AlN sintered compacts using a simple furnace, wherein the compact of mixed ultra-fine (Al+AlN) powder is placed in a cold furnace and heated in a nitrogen atmosphere. When the temperature reached about 870 K, the combustion of the compact accompanied by an intense emission of light occurs, and the temperature of the compact rises from about 870 K to about 1700 K in a few seconds, thereby obtaining a hard and porous sintered compact of AlN.

(3) Clark et al. ("Combustion Synthesis Using Microwave Energy", Ceram. Eng. Sci Proc. 11[9–10], pp. 1729–1742, 1990.) disclosed a combustion synthesis process of pouring Al powder into a raised silica crucible; then placing the crucible in a microwave for 5 minutes with consistent nitrogen gas, so as to purge the air; and thereafter actuating microwave source to initiate SHS.

(4) Miyamoto ("New Ceramic Processing Approaches Using Combustion Synthesis Under Gas Pressure", Ceramic Bulletin, Vol. 69, No. 4, pp. 686–690, 1990.) disclosed a method for preparing AlN by combustion synthesis, wherein Al powder is placed in a porous graphic crucible, and then the crucible is placed in a reactor in which nitrogen gas is filled to the pressure range of 1–10 Mpa.

(5) In the paper of Long et al. ("Aluminum Nitride, a Refractory for Aluminum for 2000° C.", Journal of American Ceramic Society, Vol. 42, No. 2, pp53–59, Feb. 1, 1959), it is stated that Mellor ("Comprehensive Treatise On Inorganic and Theoretical Chemistry", Vol. VIII, Nitrogen and Phosphorus. Longmans, Green and Co., New York, 1928.) reported that Brieglib and Geuther, in 1862, produced aluminum nitride by heating aluminum turnings in an atmosphere of nitrogen, wherein the reaction proceeds to about 700° C. Mellor also reports that Zengheis disclosed the formation of aluminum nitride, wherein aluminum was burned in oxygen, and nitrogen is substituted with oxygen while the metal was still burning.

The conventional combustion synthesis methods for preparing aluminum nitride can be roughly divided in two categories: forming a compact by molding the reactant admixture; and filling the reactants into a refractory container, such as a graphite or ceramic crucible, wherein the former needs to preprocess the reactant admixture into a compact before reaction, resulting in higher operation cost and complicated operation steps, and the latter has difficulty in achieving the preparation of aluminum nitride of good quality and production. Moreover, none of the conventional technologies can fully achieve the aforementioned factors of successfully producing aluminum nitride powder by combustion synthesis.

Hence, there is an urgent need to develop a method and an apparatus for preparing aluminum nitride for satisfactorily meeting the aforementioned factors of successfully producing aluminum nitride powder by combustion synthesis, and overcoming the shortcomings of the conventional technologies.

SUMMARY OF THE INVENTION

In view of the invention background described above, The conventional combustion synthesis methods for preparing aluminum nitride has the shortcomings of complicated operation steps, high operation cost, and poor quality and production of aluminum nitride, and cannot effectively satisfy the aforementioned factors of successfully producing aluminum nitride powder by combustion synthesis.

Therefore, it is an object of the present invention to provide a method and an apparatus for preparing aluminum nitride, thereby providing sufficient nitrogen fully penetrating the reactant admixture; preventing agglomeration of aluminum nitride produced, thus benefiting the subsequent grinding process; and achieving a complete reaction.

It is the other object of the present invention to provide a method and an apparatus for preparing aluminum nitride, thereby controlling the temperature of nitrogen gas; recycling the nitrogen gas; and cooling the reaction chamber wall, thus enhancing the quality and productivity of preparing aluminum nitride; prolonging the life of reaction chamber; and reducing the production cost.

In accordance with the aforementioned objects of the present invention, the present invention provides a method for preparing aluminum nitride. The method comprises: preparing a reactant-containing body filled with an admixture of aluminum powder, a diluent (aluminum nitride powder) and nitrogen-containing solid compound, wherein the reactant-containing body has an ignition portion located at the topmost of the reactant-containing body, a propagating portion located next to the ignition portion, a sustaining portion located next to the propagating portion, and an ending portion located next to the sustaining portion, wherein pure aluminum fine powder of which the particle size is about 25 μm is filled in the ignition portion, and a higher weight ratio of aluminum powder to the diluent is filled in the propagating portion, and a medium weight ratio of aluminum powder to the diluent is filled in the sustaining portion, and a lower weight ratio of aluminum powder to the diluent is filled in the ending portion; placing a crucible of the reactant-containing body on a base in a reaction chamber; preheating the reactant-containing body to a predetermined temperature for a predetermined period of time; vacuuming the reaction chamber; introducing a re-circulating nitrogen gas through the Teactant-containing body in the reaction chamber; re-circulating a coolant between an inner wall and an outer wall of the reaction chamber; and igniting the ignition portion to perform a combustion synthesis process, thereby preparing the aluminum nitride.

Further, a method of the present invention for preparing aluminum nitride comprises: preparing a reactant-containing body filled with an admixture of aluminum powder, a diluent (aluminum nitride powder) and nitrogen-containing solid compound, wherein the reactant-containing body has an ignition portion, an upper layer, an middle layer and a lower layer; each of the upper layer, the middle layer and the lower layer having a propagating portion locate in the center, a sustaining portion located next to the propagating portion and an ending portion located next to the sustaining portion; wherein pure aluminum fine powder of which the particle size is about 25 μm is filled in the ignition portion, and the weight ratio of aluminum powder to the diluent filled in the propagating portion of the upper layer is lowered than that filled in the ignition portion, and the weight ratios of aluminum powder to the diluent filled in the propagating portion of the middle layer and the lower layer are decreased sequentially, and for each of the upper layer, the middle layer and the lower layer, the weight ratios of aluminum powder to the diluent filled in the propagating portion, the sustaining portion and the ending portion are decreased sequentially; placing a crucible of the reactant-containing body on a base in a reaction chamber; preheating the reactant-containing body to a predetermined temperature for a predetermined period of time; vacuuming the reaction chamber; introducing a re-circulating nitrogen gas through the reactant-containing body in the reaction chamber; re-circulating a coolant between an inner wall and an outer wall of the reaction chamber; and igniting the ignition portion to perform a combustion synthesis process, thereby preparing the aluminum nitride.

Further, the present invention provides an apparatus for preparing aluminum nitride. The apparatus comprise: a reaction chamber having an inner wall and an outer wall, wherein a coolant is re-circulated between the inner wall and the outer wall; a base having a plurality of holes, wherein the base is used for supporting a crucible of a reactant-containing body; a preheating device, used for preheating the reactant-containing body to a predetermined temperature for a predetermined period of time; a nitrogen re-circulation system used for withdrawing a hot nitrogen gas and delivering a cool nitrogen gas, wherein the nitrogen re-circulation system comprising a cooling unit used for cooling the hot nitrogen gas to form the cool nitrogen gas; and an igniting device used for igniting the reactant-containing body, thereby preparing the aluminum nitride.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention is featured in providing a reactant-containing body having a plurality of weight ratios of aluminum powder to aluminum nitride, wherein the aluminum nitride therein is used as a diluent for lowering the reaction temperature, thereby minimizing the coalescence of molten aluminum powder, thus achieving higher product yield. A feature of the present invention is to fill in the admixture with different ratios of aluminum powder to the diluent (aluminum nitride powder) at different stages of the combustion synthesis process in accordance with the requirements of reaction temperature. At the beginning (propagating) stage of the combustion synthesis process, a higher weight ratio of aluminum powder to the diluent (aluminum nitride powder) is used to reduce the amount of diluent (AlN), so as to raise the reaction temperature, thereby enabling combustion wave to be propagated rapidly. At the middle (sustaining) stage of the combustion synthesis process, a medium ratio of aluminum powder to the diluent (aluminum nitride powder) is used together with re-circulating nitrogen gas to maintain the reaction temperature, thereby maintaining the optimum combustion state. At the final (ending) stage of the combustion synthesis process, since the reaction chamber has accumulated more energy and higher temperature, a lower ratio of aluminum powder to the diluent (aluminum nitride powder) is used to increase the amount of diluent (aluminum nitride) to ease the reaction, thus gradually finishing the reaction.

Figure 1:
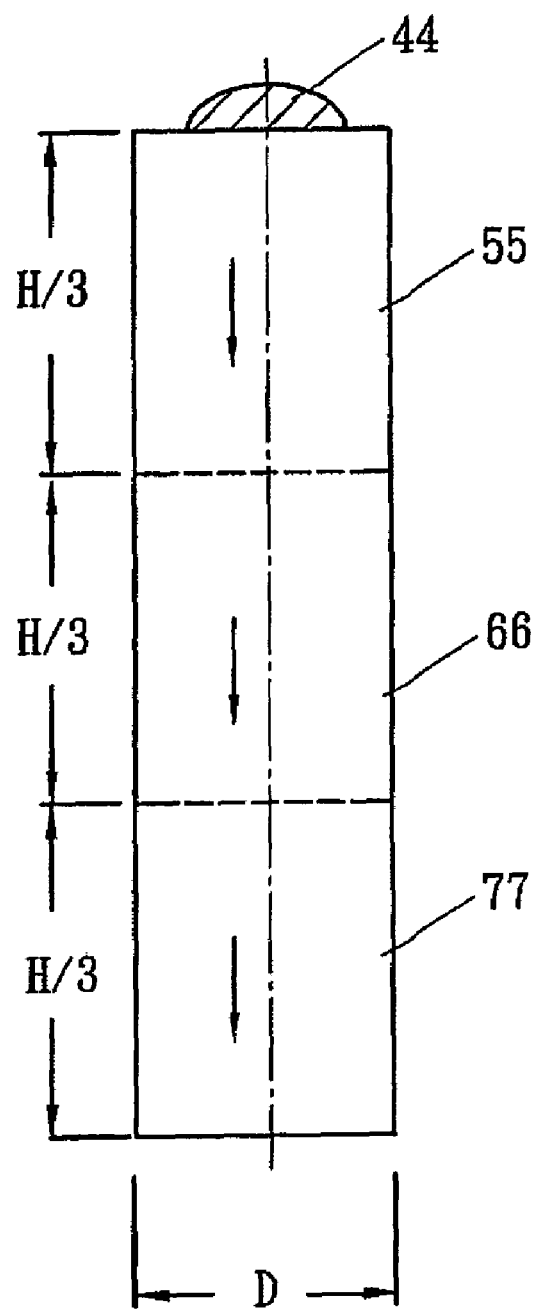
FIG. 1 is a schematic side-view showing the direction of combustion wave propagating in a reactant-containing body while preparing aluminum nitride, wherein the height (H) of the reactant-containing body is greater than about twice as much as the diameter (D) of the reactant-containing body, i.e. H>2D.
Figure 2A:
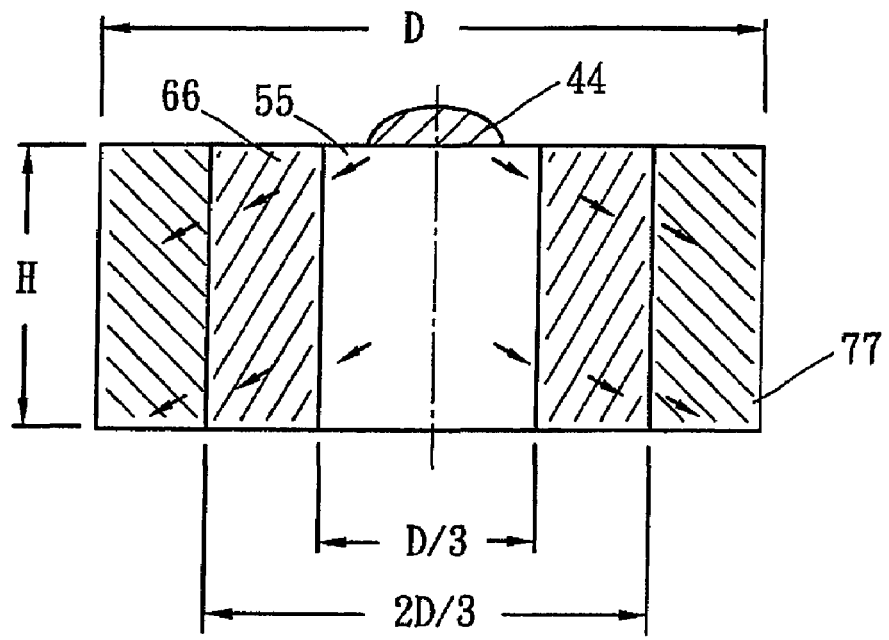
FIG. 2A and FIG. 2B are schematic side and top views showing the direction of combustion wave propagating in a reactant-containing body while preparing aluminum nitride, wherein the diameter (D) of the reactant-containing body is greater than about twice as much as the height (H) of the reactant-containing body, i.e. D>2H.
Figure 2B:
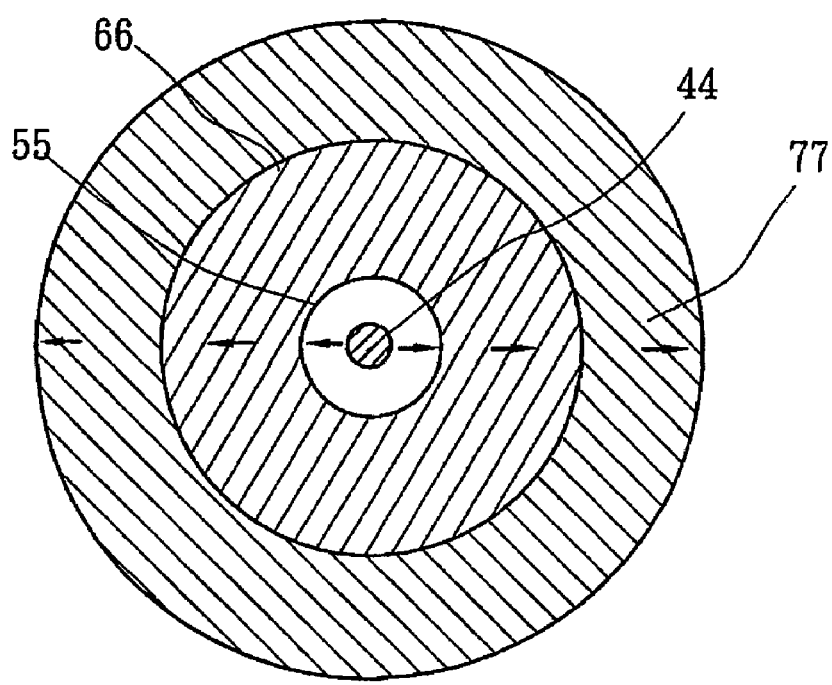

Referring to FIG. 1, FIG. 1 is a schematic side-view showing the direction of combustion wave propagating in a reactant-containing body while preparing aluminum nitride, wherein the height (H) of the reactant-containing body is greater than about twice as much as the diameter (D) of the reactant-containing body, i.e. H>2D. Such as shown in FIG. 1, once an ignition portion 44 located on the topmost of the reactant-containing body is ignited, the combustion wave propagates basically along the 1-D direction from the top of the reactant-containing body to the bottom thereof, which are a propagating portion 55, a sustaining portion 66 and an ending portion 77 respectively corresponding to the stages of the combustion synthesis process as developed, each of the propagating portion 55, the sustaining portion 66 and the ending portion 77 occupying vertically about ⅓ of the reactant-containing body. Referring to FIG. 2A and FIG. 2B, FIG. 2A and FIG. 2B are schematic side and top views showing the direction of combustion wave propagating in a reactant-containing body while preparing aluminum nitride, wherein the diameter (D) of the reactant-containing body is greater than about twice as much as the height (H) of the reactant-containing body, i.e. D>2H. Such as shown in FIG. 2A and FIG. 2B, once an ignition portion 44 located on the topmost of the reactant-containing body is ignited, the combustion wave propagates basically along the 1-D direction from the central part of the reactant-containing body to the outer part thereof, which are a propagating portion 55, a sustaining portion 66 and an ending portion 77 distributed horizontally, each of the propagating portion 55, the sustaining portion 66 and the ending portion 77 occupying horizontally about ⅓ of the reactant-containing body. For promoting the efficiency of combustion synthesis process, the admixture of aluminum powder and aluminum nitride with various ratios and nitrogen-containing solid compound are respectively filled in the ignition portion 44, the propagating portion 55, the sustaining portion 66 and the ending portion 77. For properly controlling the reaction temperature, the longer the combustion synthesis process goes, the more diluent (smaller weight ratio of aluminum powder to the diluent) needs. For example, pure aluminum fine powder of which the particle size is about 25 μm is filled in the ignition portion 44; the weight ratio of aluminum powder to the diluent (aluminum nitride powder) filled in the propagating portion 55 is between about 6:1 to about 12:1; the weight ratio of aluminum powder to the diluent (aluminum nitride powder) filled in the sustaining portion 66 is between about 2:1 to about 6:1; and the weight ratio of aluminum powder to the diluent (aluminum nitride powder) filled in the ending portion 77 is between about 1:1 to about 4:1.

Moreover, if the height (H) of the reactant-containing body is between half of the diameter D) thereof and double of the diameter thereof, i.e. $D/2 \leq H \leq 2D$, then the reactant-containing body can be divided into an ignition portion, an upper layer, an middle layer and a lower layer. Each of the upper layer, the middle layer and the lower layer has a propagating portion, a sustaining portion and an ending portion. Just as described above, pure aluminum fine powder of which the particle size is about 25 μm is filled in the ignition portion, and the weight ratio of aluminum powder to the diluent filled in the propagating portion of the upper layer is lowered than that filled in the ignition portion, and the weight ratios of aluminum powder to the diluent filled in the propagating portion of the middle layer and the lower layer are decreased sequentially, i.e. the weight ratio of aluminum powder to the diluent filled in the propagating portion of the middle layer is smaller than that filled in the propagating portion of the upper layer; the one filled in the propagating portion of the lower layer is smaller than that in the propagating portion of the middle layer. Then, for each of the upper layer, the middle layer and the lower layer, the weight ratios of aluminum powder to the diluent filled in the propagating portion, the sustaining portion and the ending portion are decreased sequentially, i.e. the ratio filled in the sustaining portion is smaller than that filled in the propagating portion; and the ratio filled in the ending portion is smaller that filled in the sustaining portion.

For practicing the case shown in FIG. 1, merely a hollow housing is needed for filling different ratios of aluminum powder to a diluent. However, for practicing the case shown in FIG. 2A and FIG. 21 or the case of $D/2 \leq H \leq 2D$, a multi-layered structure has be first placed into a hollow housing for filling various ratios of aluminum powder to the diluent.

Figure 3A:
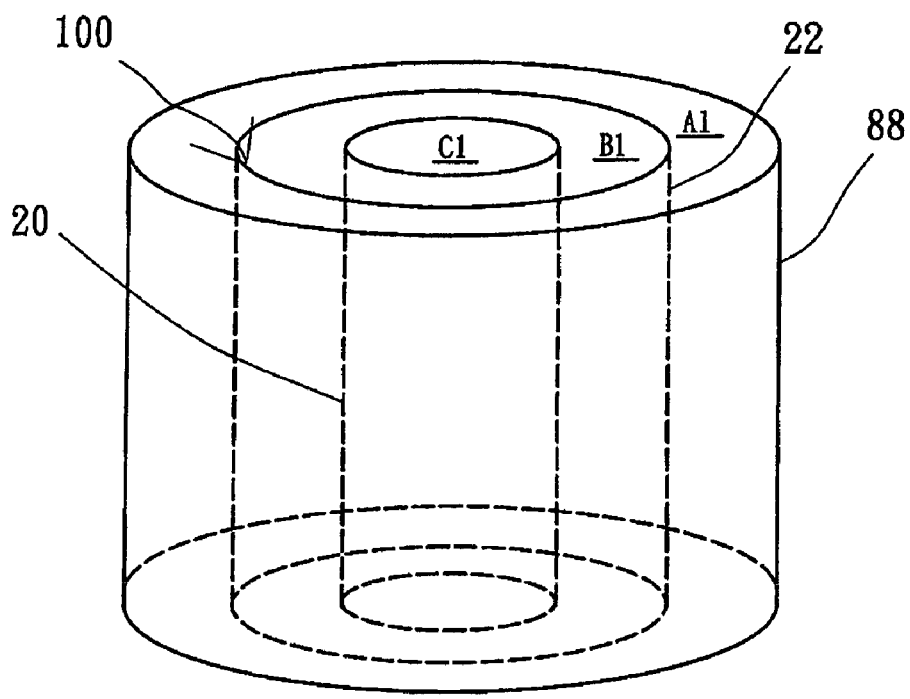
FIG. 3A is a schematic diagram showing the 3-D view of a reactant-containing body having a multi-layered structure used for preparing aluminum nitride, according to a preferred embodiment of the present invention.
Figure 3B:
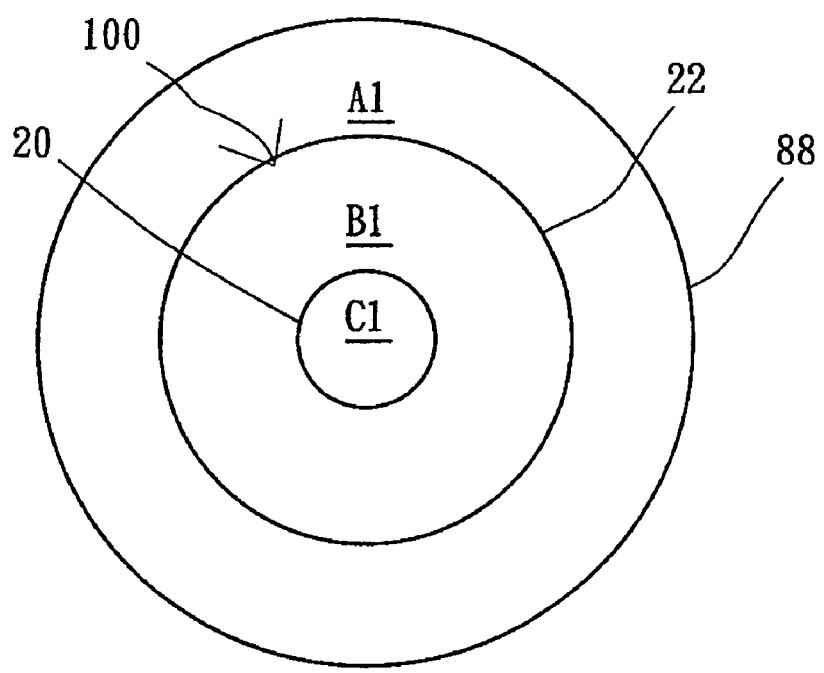
FIG. 3B is a schematic diagram showing the top view of the reactant-containing body having a multi-layered structure used for preparing aluminum nitride, according to the preferred embodiment of the present invention.

Referring to FIGS. 3A and 3B, FIG. 3A and FIG. 3B are schematic diagrams respectively showing the 3-D view and the top view of a reactant-containing body having a multi-layered structure used for preparing aluminum nitride, according to a preferred embodiment of the present invention, wherein a multi-layered structure 100 is composed of cylinders 20 and 22, and then is placed in a hollow housing 88 to form the reactant-containing body, and thus three divisions C1, B1 and A1 respectively corresponding to the propagating portion, the sustaining portion and the ending portion described above are formed to accommodate the admixtures of various ratios of aluminum powder to a diluent. After, the admixtures are respectively filled in the divisions A1, B1 and C1, the cylinders 20 and 22 can be removed or stay, i.e. the cylinders 20 or 22 may or may not participate the combustion reaction in accordance with the actual situations. The hollow housing 88 can be made of such as graphite or aluminum etc., and the shape thereof is the same as the component forming the multi-layered structure, such as a cylinder.

Figure 4A:
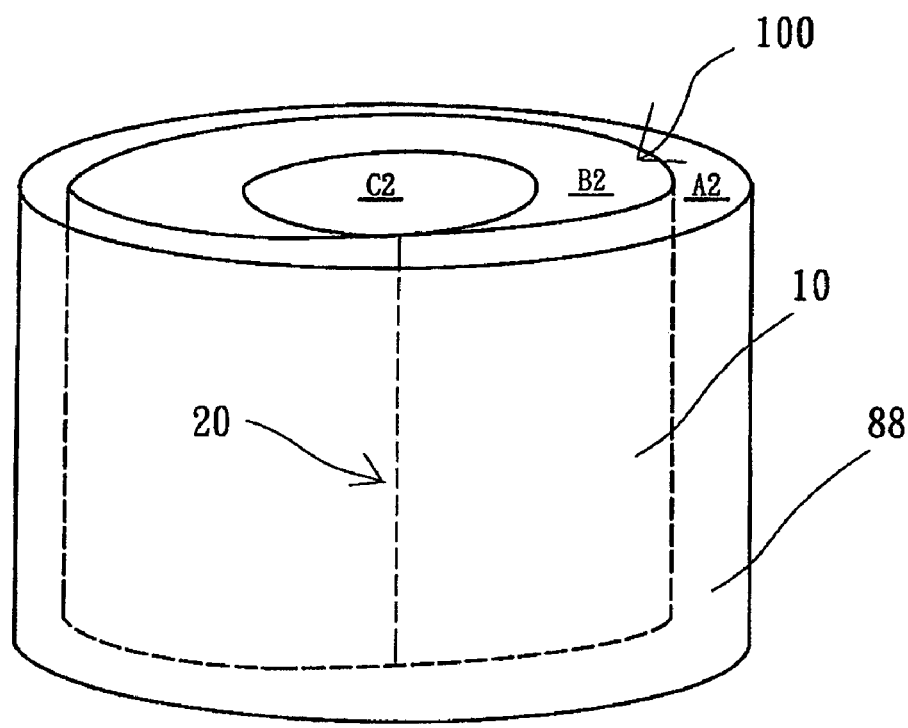
FIG. 4A is a schematic diagram showing the 3-D view of a reactant-containing body having a multi-layered structure used for preparing aluminum nitride, according to another preferred embodiment of the present invention.
Figure 4B:
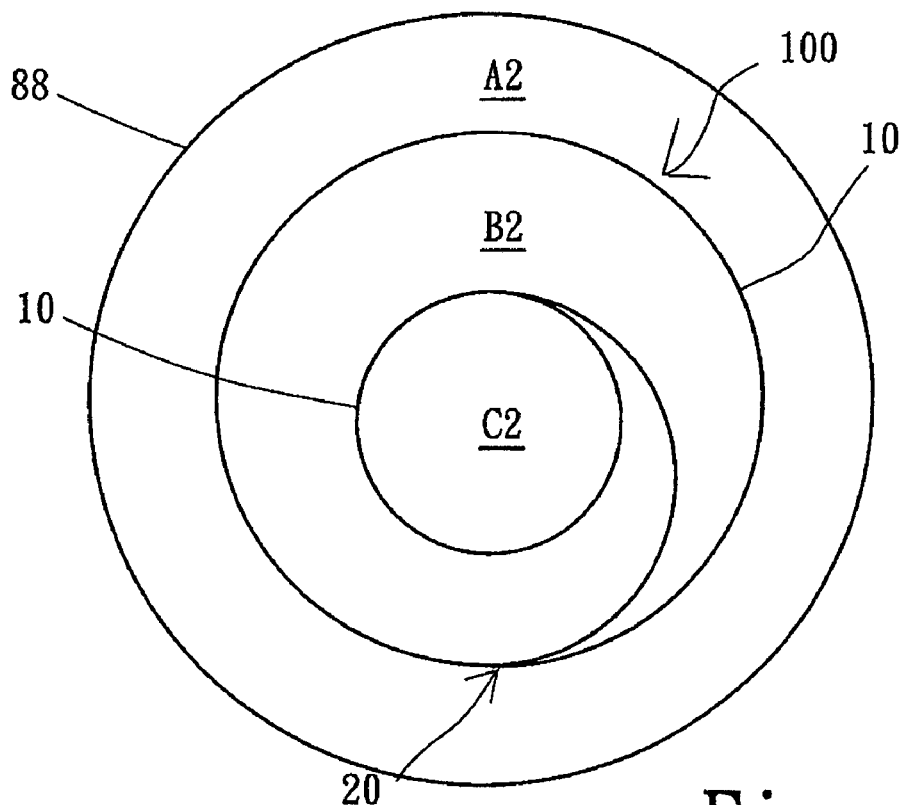
FIG. 4B is a schematic diagram showing the top view of the reactant-containing body having a multi-layered structure used for preparing aluminum nitride, according to another preferred embodiment of the present invention.

Further, the multi-layered structure 100 also can be made in different forms. Referring to FIGS. 4A and 4B, FIG. 4A is a schematic diagram showing the 3-D view and the top view of a reactant-containing body having a multi-layered structure used for preparing aluminum nitride, according to another preferred embodiment of the present invention, wherein the multi-layered structure 100 can be made by rolling one-piece element 10 in a helical form, and the outer end 20 of the helical form are sealed as a closed end for containing the admixture, and then is placed in a hollowing housing 88 to form a reactant-containing body, and thus for example, three areas C2, B2, and a central area A2 respectively corresponding to the propagating portion, the sustaining portion and the ending portion are formed, so that the admixture of various ratios of aluminum powder to aluminum nitride powder can be filled in area A2, area B2 and the central area C2 respectively. The outer end 20 can be tied with an aluminum wire, or welded to the exterior of one-piece element 10, or use any applicable way to form a closed end.

Figure 5:
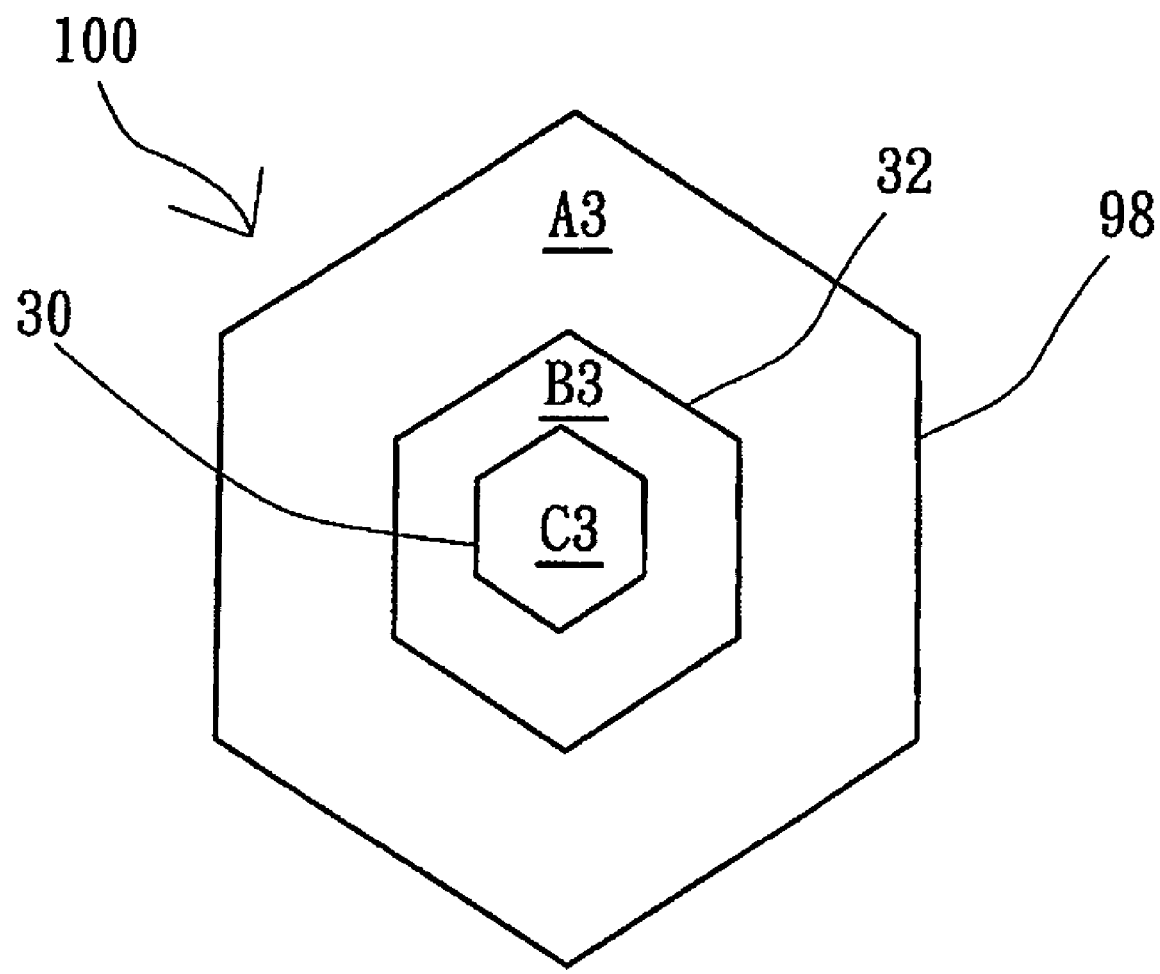
FIG. 5 is a schematic diagram showing the top view of a reactant-containing body having a multi-layered structure used for preparing aluminum nitride, according to still another preferred embodiment of the present invention.

Referring to FIG. 5, FIG. 5 is a schematic diagram showing the top view of a reactant-containing body having a multi-layered structure used for preparing aluminum nitride, according to still another preferred embodiment of the present invention. The multi-layered structure 100 can be composed of a plurality of polygonal prisms, such as three hexagonal prisms 30, 32 and 34 shown in FIG. 5, and is placed into a hollow housing 99 of hexagonal prism to form the reactant-containing body, wherein three divisions C3, B3 and A3 respectively corresponding to the propagating portion, the sustaining portion and the ending portion are formed to accommodate the admixture of aluminum and a diluent. Moreover, the multi-layered structure 100 can be made of such as aluminum net, aluminum sheet, aluminum foil, or any refractory material as long as several different areas can be divided for filling the aluminum and aluminum nitride of various ratios.

Figure 6:
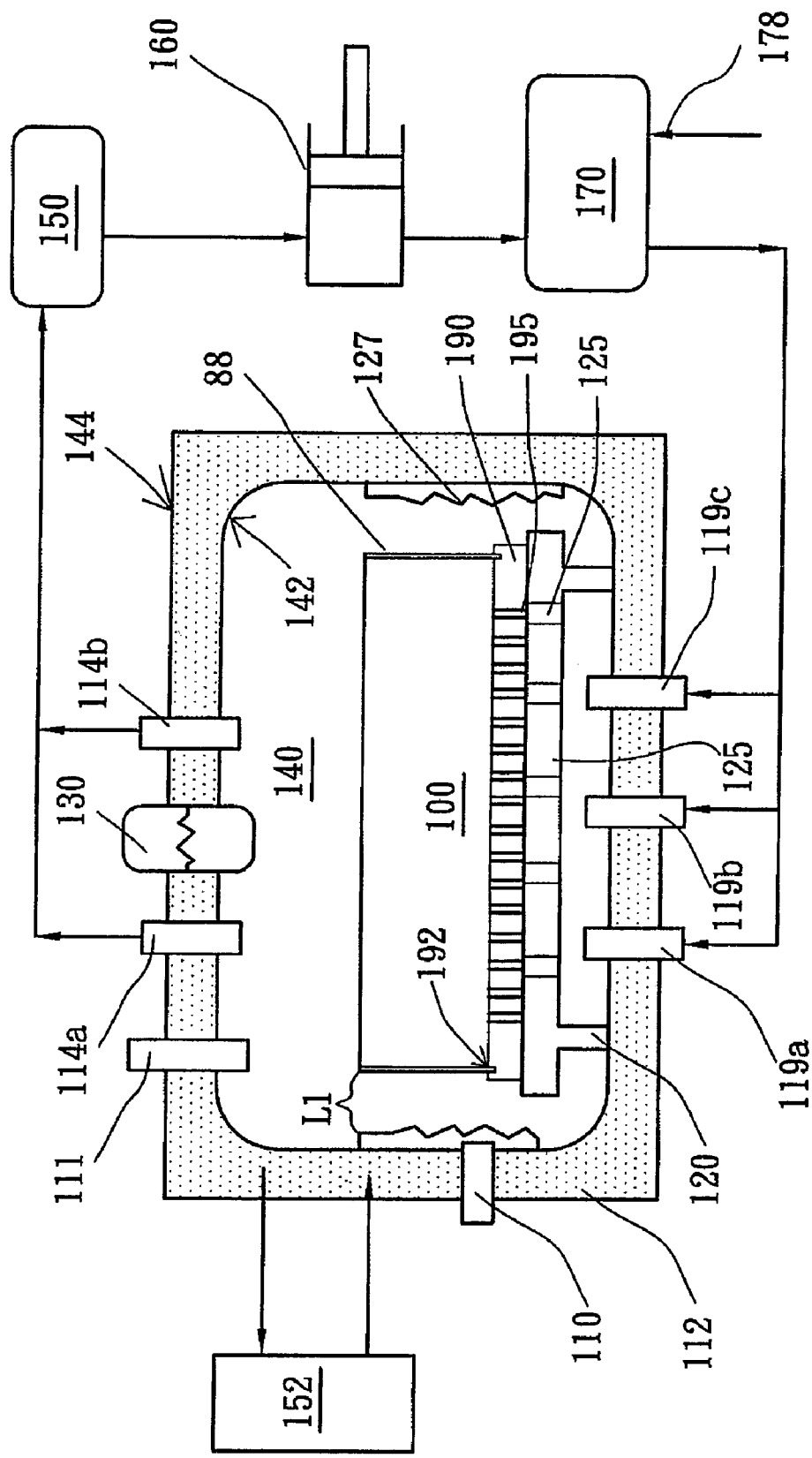
FIG. 6 is a schematic diagram illustrating an apparatus for preparing aluminum nitride according to a preferred embodiment of the present invention.
Figure 7:
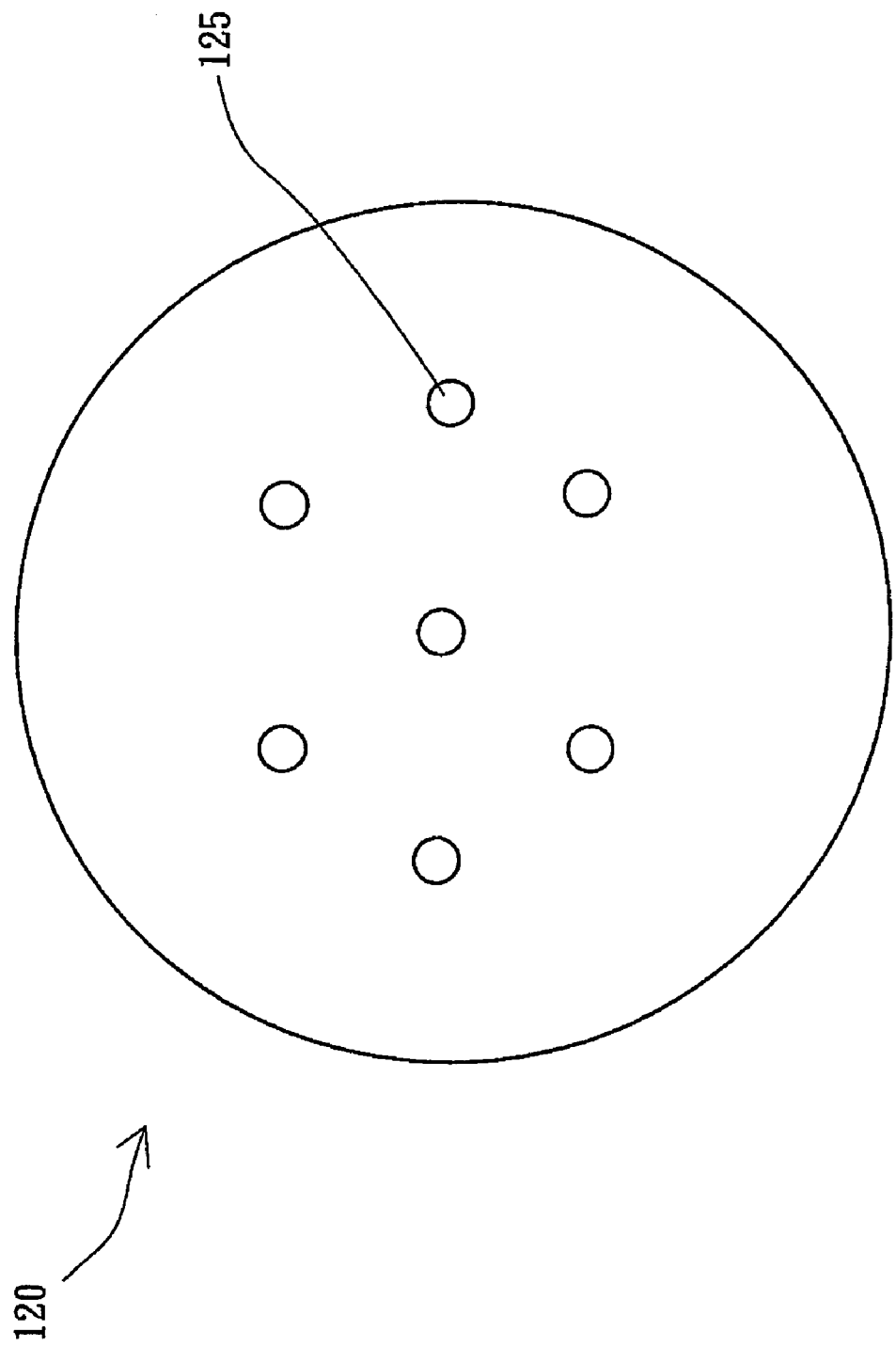
FIG. 7 is a schematic diagram illustrating the structure of a crucible for forming the reactant-containing body according to the preferred embodiment of the present invention.
Figure 8:
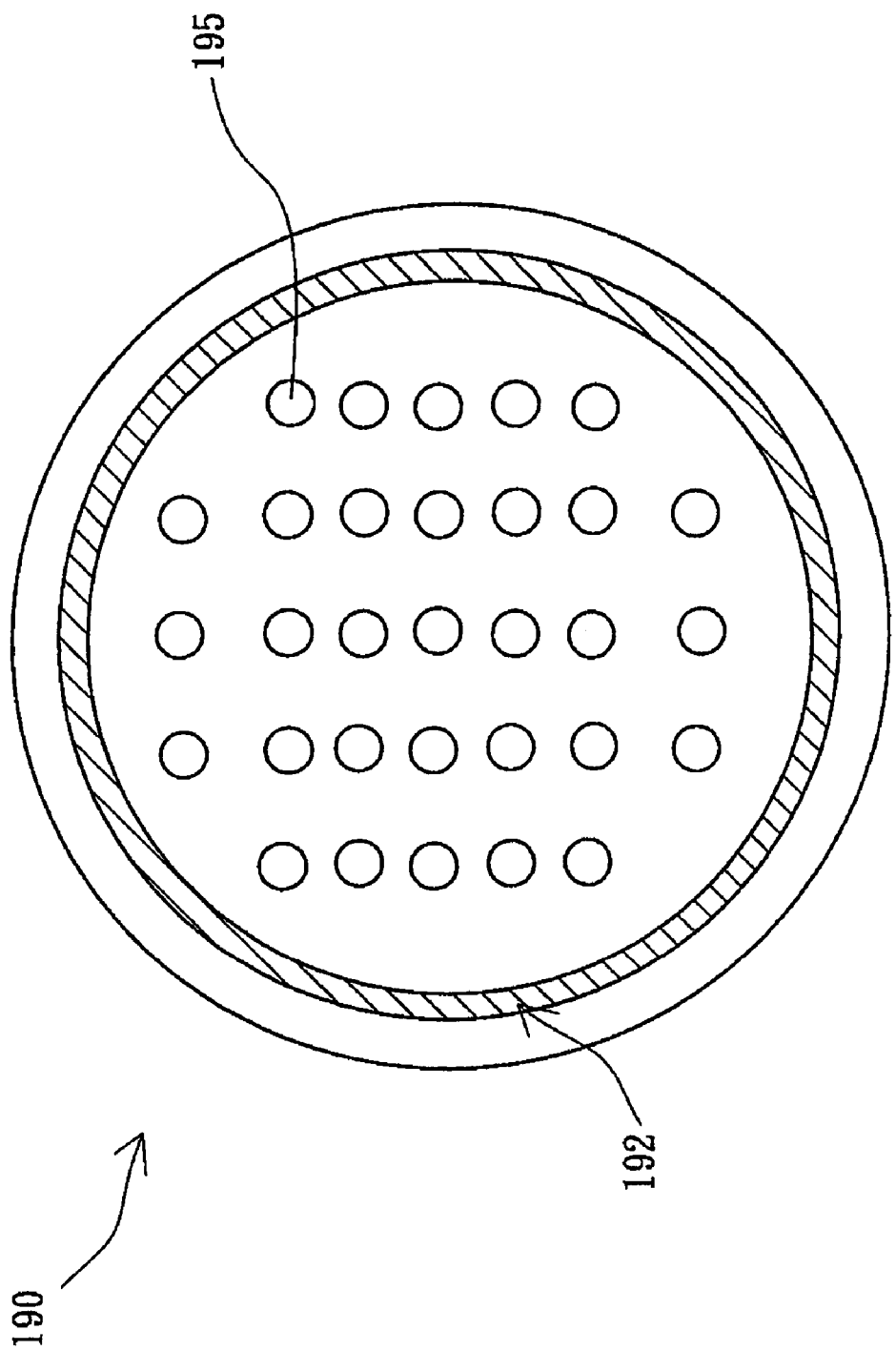
FIG. 8 is a schematic diagram illustrating the structure of a base of the apparatus for preparing aluminum nitride according to the preferred embodiment of the present invention.

Referring to FIG. 6 to FIG. 8, FIG. 6 is a schematic diagram illustrating an apparatus for preparing aluminum nitride according to a preferred embodiment of the present invention; FIG. 7 is a schematic diagram illustrating the structure of a crucible for forming the reactant-containing body according to the preferred embodiment of the present invention; and FIG. 8 is a schematic diagram illustrating the structure of the base of the apparatus for preparing aluminum nitride according to the preferred embodiment of the present invention. There is an annular groove 192 located on the outer part of a crucible 190 for inserting and fixing the hollow housing 88. After the hollow housing 88 is inserted into the annular groove 192 on the crucible 190, the multi-layered structure 100 is placed in the hollow housing 88 in a reaction chamber 140 so as to form the frame of a reactant-containing body, wherein the crucible 190 has a plurality of through holes 195 used for allowing nitrogen gas to pass through. After the frame of the reactant-containing body is ready, the step of filling the admixtures of aluminum, aluminum nitride and nitrogen-containing solid compound is performed according to the description described above, i.e. lower ratio of aluminum powder to a diluent filled in the ending portion; a medium ratio in the sustaining portion 66; a higher ratio in the propagating portion 55; and pure aluminum fine powder placed on the top of the reactant-containing body. After the reactant-containing body is ready, the crucible 190 of the reactant-containing body is placed on a base 120 having a plurality of through holes 125, and then a preheating device 127 installed around the reactant-containing body with a gap L1 is turned on to heat up the reactant-containing body to a predetermined temperature (such as about 90° C. to about 400° C.) for a predetermined period of time (such as about 30 minutes to about 90 minutes), thereby displacing moisture contained in the reactant-containing body. Thereafter, the preheating device 127 is turned off, and then the reaction chamber 140 is vacuumed through a vacuum pipe 110. The crucible 190 can be made of such as graphite, and the shape thereof is correspondent to the hollow housing 88.

The reaction chamber 140 has two layers of wall, an inner wall 142 and an outer wall 144. Between the inner wall 142 and the outer wall 144, a coolant 112 cooled by a cooling unit 152 is re-circulated to decrease the temperature of the reaction chamber 140, so as to prolong the life of the reaction chamber 140. The coolant 112 can be such as water. Next, a nitrogen re-circulation system is used to introduce nitrogen gas into the reaction chamber 140 through gas inlets 119a, 119b, 119c, the through holes 122 of the base 120 and the reactant-containing body filled with the admixtures. The nitrogen re-circulation system comprises a cooling unit 150, a compressor 160 and a nitrogen supply tank 170. Thereafter, the reactant-containing body is ignited by an igniting device 130, such as an electric heater made of tungsten filament, tungsten tape, graphite tape or plate, so as to perform a combustion synthesis process for preparing the aluminum nitride. During the combustion synthesis process, the nitrogen gas reacted is heated and withdrawn through gas outlets 114a and 114b to the cooling unit 150. The hot nitrogen is cooled down in the cooling unit 150, and then is compressed by the compressor 160, so that cool nitrogen gas can be delivered back to the reaction chamber 140 (with higher pressure than that in the reaction chamber 140). Although the nitrogen gas is recycled, yet there is certain amount of nitrogen gas loss after reaction, therefore the nitrogen supply tank 170 is used to make up the loss, wherein the nitrogen supply tank 170 has a supply inlet 178 for receiving additional nitrogen gas. After the reaction is done, a vent 111 is used for recovering the pressure in the reaction chamber 140 back to atmospheric pressure.

Moreover, another feature of the present invention is to provide a nitrogen re-circulation system having a cooling unit. The purposes of using the nitrogen re-circulation system having the cooling unit are stated as follows.

(1) The reaction temperature of aluminum nitride is lowered to maintain the optimum reaction temperature, thereby avoiding the AlN grains growing at high temperatures, wherein the AlN growing at high temperatures will easily form agglomeration by sintering, the agglomeration increasing the difficulty level of subsequent grinding treatment.

(2) Since the temperature in the reaction chamber increases during reaction, the pressure also increases accordingly due to the expansion of nitrogen gas, and it is difficult to deliver the nitrogen gas back to the reaction chamber due to the high pressure in the reaction chamber, resulting the interruption of delivering nitrogen gas and slowing down or even stopping the combustion synthesis process, especially for the reactant admixture of large bulk. Thus, with the nitrogen source having the cooling unit, the temperature in the reaction chamber can be cooled down rapidly and the pressure therein can be reduced accordingly, so that the present invention does not need to use the nitrogen source of extreme high pressure, and the stability and continuity of combustion synthesis process can be assured.

(3) After the combustion synthesis process is done, the cool nitrogen gas re-circulation can cool the reaction chamber and the AlN product quickly, thus reducing the probability of forming aluminum hydroxide resulted from the contact between the surfaces of AlN grains and air. Therefore, the equipment reusability is increased.

(4) The proper cooling during reaction can reduce the amount of diluent (AlN) added, thus increasing the product yield substantially. The recycle of nitrogen gas can effectively reduce the expense of nitrogen.

To sum up, by combining the aforementioned nitrogen re-circulation system and different ratios of aluminum powder to a diluent (aluminum nitride powder) filled in different areas of the reactant-containing body at different stages of the combustion synthesis, the reactants can be continuously reacted under the optimum reaction conditions so as to obtain excellent reaction results, so that the quality of aluminum nitride product can be assured; the subsequent grinding step can be performed easily; and the yield can be promoted.

On the other hand, one essential component added in the admixture of the present invention is a nitrogen-containing solid compound which is less than or equal to about 10% of the admixture by weight, and the nitrogen-containing solid compound can be sodium nitride ($NaN_3$) powder, potassium nitride ($KN_3$) and barium nitride ($Ba_3N_2$), or the mixture thereof. Further, besides aluminum nitride powder, it is noted that the diluent used in the present invention can be such as $Al_2O_3$, BN, $Si_3N_4$, TiN, SiC, $ZrO_2$, $TiO_2$ or $SiO_2$ etc.

Hereinafter, the present invention will be explained with the following examples, which are merely stated as examples for explanation and do not limit the scoped of the present invention.

Examples 1–9 utilizes a small graphite hollow housing installed on a small graphite crucible; examples 10–13 utilizes a large graphite housing installed on a large graphite crucible; and examples 14–17 merely dispose the material on a proper graphite crucible without using a hollow housing. The small graphite hollow housing is a cylinder of 15 cm in outer diameter, 30 cm in height and 1.5 cm in thickness; the small graphite crucible is a cylinder of 15 cm in outer diameter and 10 cm in height; the large graphite hollow housing is a cylinder of 68 cm in diameter, 30 cm in height and 2.2 cm in thickness; the large graphite crucible is a cylinder of 68 cm in outer diameter and 10 cm in height. In all the examples, aluminum nitride is used as a diluent, and each of the graphite crucibles and the bases has a plurality of holes for introducing nitrogen gas through the reactant containing body.

EXAMPLE 1

With Chamber Wall Cooling Only

The admixture of aluminum:aluminum nitride=4:1 and 1.0% $NaN_3$ by weight is filled in the small graphite housing to form a reactant-containing body, and the total mass of the admixture is 1.060 kg with the density of 0.335 g/cm$^3$. Then, pure aluminum powder layer of 3 mm in thickness and 50 mm in diameter is placed on the center of the top of the reactant-containing body (i.e. the ignition portion 44 in FIG. 1). After the reactant-containing body is ready, a preheating device is turned on to keep the temperature of the reaction chamber at about 90° C. to about 400° C. for about 30 to 60 minutes. Thereafter, the preheating device is turned off and a vacuum system is used for vacuuming the reaction chamber. Then, about 1 atm nitrogen gas is introduced into the reaction chamber, and the coolant (water) starts re-circulating between an inner wall and an outer wall of the reaction chamber, wherein the temperature of the coolant is kept at about 50° C. Thereafter, about 3 atm nitrogen gas is introduced into the reactor chamber, and electric current of 30 to 40 Amperes and 50 to 60 Volts is applied to a tungsten filament (heating device) for about 1 to 1.5 minutes. As soon as the pure aluminum powder on the top of the reaction-containing body is ignited, the tungsten filament is turned off, and the gas inlets below the base is opened to introduce 120 L/min nitrogen gas flow through the reactant-containing body, wherein the pressure of nitrogen gas is maintained at 2 to 3 atm. When the temperature of the reactant-containing body reaches about 2000° C., the temperature does not rise any more, wherein the nitrogen gas is not shut off until the pressure of the reaction chamber reaches about 4 atm, thus completing the overall reaction, which takes about 9 minutes 50 seconds in total. Meanwhile, the coolant continues re-circulating for two more hours, so as to lower the temperature of the reaction chamber.

The products are yellow; and in loosened and porous form. The weight of the products after reaction is about 1510 grams, and the conversion rate of aluminum to aluminum nitride is 99.2%, wherein O %=0.0477%, N %=33.89%, C %=0.0771%, S %=0.0039%.

EXAMPLE 2

With Chamber Wall Cooling and Nitrogen Gas Re-Circulating

Example 2 is similar to example 1, except that nitrogen gas is re-circulated in/out the reaction chamber in example 2. When the temperature of the reactant-containing body reaches 1900° C., the gas inlets and the gas outlets are opened for withdrawing the nitrogen gas from the top of the reaction chamber at 25 to 35 L/min. After the nitrogen gas is cooled down, the nitrogen gas is pumped to a nitrogen supply tank, and then outputted back into the reaction chamber with the flow rate increased to 150 L/min. When the temperature of the reactant-containing body reaches 1950° C. without any increase, and the pressure of the reaction chamber reaches 4 atm, the nitrogen gas flow rate is reduced to 30 L/min, thus completing the overall reaction, which takes about 10 minutes 20 seconds in total. Afterwards, the nitrogen gas is kept on re-circulating for about 30 to 40 minutes till the temperature of the reactant-containing body reaches about 400° C.

The products are yellow; in loosened and porous form; and frangible. The weight of the products after reaction is about 1450 grams, and the conversion rate of aluminum to aluminum nitride is 99.8%, wherein O %=0.0431%, N %=33.92%, C %=0.076%, S %=0.0037%.

EXAMPLES 3–8

Different Ratios of Al:AlN in Example 2

Examples 3–8 are similar to example 2, besides different weight ratios of aluminum powder to aluminum nitride powder are applied thereto. The results of examples 3–8 are shown in Table 1.

TABLE 1

| Example | Al:AlN | Density(g/cm³) | Initial P(atm) | N₂ flow(l/min) | Max T (° C.) | Conversion rate | O% | N% | Color | Product Superficial Pattern | Particle Size (μm) |
|---|---|---|---|---|---|---|---|---|---|---|---|
| 3 | 1:1 | 0.39 | 2 | 120–150 | 1750 | 99.2 | 0.404 | 33.87 | white | loosened | 10–20 |
| 4 | 2:1 | 0.397 | 2 | 120–150 | 1800 | 99.7 | 0.398 | 34.05 | white | loosened and porous | 15–25 |
| 5 | 4:1 | 0.347 | 2 | 120–150 | 1900 | 99.8 | 0.056 | 34.13 | white & yellow | porous | 25–45 |
| 6 | 6:1 | 0.303 | 2 | 120–150 | 2000 | 99.7 | 0.164 | 34.01 | yellow | porous and few whiskers | 30–50 |
| 7 | 8:1 | 0.317 | 2 | 120–150 | 2150 | 99.6 | 0.096 | 33.92 | yellow | porous and a plurality of whiskers | 35–55 |
| 8 | 10:1 | 0.313 | 3 | 120–150 | 2250 | 99.6 | 0.133 | 33.92 | yellow | porous and a lot of whiskers | 40–60 |

EXAMPLE 9

Various Ratios of Al:AlN Filled in the Hollow Housing

Example 9 is similar to example 2, except that various ratios of Al:AlN are filled in the hollow housing of example 9. The admixture (0.35 kg) of aluminum:aluminum nitride 2:1 and 1.0% NaN₃ by weight is filled in the bottom of the hollow housing (i.e. the ending portion 77 in FIG. 1); the admixture (0.35 kg) of aluminum:aluminum nitride=4:1 and 1.0% NaN₃ by weight is filled in the middle part of the hollow housing (i.e. the sustaining portion 66 in FIG. 1); and the admixture (0.34 kg) of aluminum:aluminum nitride=6:1 and 1.0% NaN₃ by weight is filled in the upper part of the hollow housing (i.e. the propagating portion 55 in FIG. 1), wherein the weight of the reactant material is 1.04 kg in total and the density thereof is 0.329 kg/cm³. Thereafter, pure aluminum powder layer of 3 mm in thickness and 50 mm in diameter is placed on the center of the top of the reactant-containing body (i.e. the ignition portion 44 in FIG. 1).

The subsequent steps of example 9 are similar to those of example 2, and the reaction takes about 10 minutes 20 seconds. After reaction, the products are yellow; in loosened and porous form; and frangible; no whiskers exist in the products; the weight of the products after reaction is about 1415 grams; and the conversion rate of aluminum to aluminum nitride is 99.9%, wherein O %=0.0429%, N %=34.14%, C %=0.087%, S %=0.0045%.

EXAMPLE 10

With Chamber Wall Cooling and Nitrogen Gas Re-Circulating

The admixture of aluminum:aluminum nitride=4:1 and 1.0% NaN₃ by weight is filled in the large graphite housing to form a reactant-containing body, and the total mass of the admixture is 30.3 kg with the density of 0.341 g/cm³. Then, pure aluminum powder layer of 3 mm in thickness and 50–100 mm in diameter is placed on the center of the top of the reactant-containing body (i.e. the ignition portion 44 in FIG. 2). After the reactant-containing body is ready, a preheating device is turned on to keep the temperature of the reaction chamber at about 90° C. to about 400° C. for about 30 to 90 minutes. Thereafter, the preheating device is turned off and a vacuum system is used for vacuuming the reaction chamber. Then, about 1 atm nitrogen gas is introduced into the reaction chamber, and the coolant (water) starts re-circulating between an inner wall and an outer wall of the reaction chamber, wherein the temperature of the coolant is kept at about 50° C. Thereafter, about 2 atm nitrogen gas is introduced into the reactor chamber, and electric current of 30 to 40 Amperes and 50 to 60 Volts is applied to a tungsten filament (heating device) for about 1 to 1.5 minutes. As soon as the pure aluminum powder on the top of the reaction-containing body is ignited, the tungsten filament is turned off, and the gas inlets below the base is opened to introduce 150 to 750 L/min nitrogen gas flow through the reactant-containing body, wherein the pressure of nitrogen gas is maintained at 2 to 3 atm. When the temperature of the reactant-containing body reaches about 2000° C., the gas inlets and the gas outlets are opened for withdrawing the nitrogen gas from the top of the reaction chamber at 120 to 200 L/min. After the nitrogen gas is cooled down, the nitrogen gas is pumped to a nitrogen supply tank, and then outputted back into the reaction chamber with the flow rate increased to 750 to 1000 L/min. When the temperature of the reactant-containing body reaches 2100 to 2200° C. without any increase, and the pressure of the reaction chamber reaches 3.5 atm, the nitrogen gas flow rate is reduced to 120 L/min, thus completing the overall reaction, which takes about 24 minutes in total. Afterwards, the nitrogen gas is kept on re-circulating for about 50 minutes till the temperature of the reactant-containing body reaches about 50° C.

After reaction, the products on the top and the perimeter of the reactant-containing body are white-gray; and in loosened form. The products in the central area are yellow; and in loosened and porous form with whiskers. The weight of the products after reaction is about 42.1 kg, and the conversion rate of aluminum to aluminum nitride is 99.1%, wherein O %=0.0821%, N %=33.58%, C %=0.0237%, S %=0.0022%.

EXAMPLE 11

Various Ratios of Al:AlN Filled in the Hollow Housing with Removing Multi-Layered Structure Example 11 is similar to example 10, except that various ratios of Al:AlN are filled in a multi-layered structure of the hollow housing of example 10. Please refer to FIG. 3A and FIG. 3B. In the large graphite hollow housing, an aluminum plate of 65 cm long, 30 cm wide and 0.5 mm thick is used to form a cylinder of 20 cm in diameter (i.e. cylinder 20); and the other aluminum plate of 128 cm long, 30 cm wide and 0.5 mm thick is used to form a cylinder of 40 cm in diameter (i.e. cylinder 22). The admixture (2.8 kg; 0.318

$g/cm^3$) of aluminum:aluminum nitride=8:1 and 1.0% $NaN_3$ by weight is filled in the division C1; the admixture (8.9 kg; 0.328 $g/cm^3$) of aluminum:aluminum nitride=6:1 and 1.0% $NaN_3$ by weight is filled in the division B1; and the admixture (18.2 kg; 0.331 $g/cm^3$) of aluminum:aluminum nitride=4:1 and 1.0% $NaN_3$ by weight is filled in the division A1. After the admixtures are completely filled in the reactant-containing body, the cylinders 20 and 22 are removed.

The subsequent steps of example 11 are similar to those of example 10, and the reaction takes about 25 minutes 10 seconds. After reaction, white-gray loosened products occurs on the top and the perimeter; the products existing in the central area are homogeneous yellow, in loosened porous form with whiskers and frangible; the weight of the products after reaction is about 40.8 kg; and the conversion rate of aluminum to aluminum nitride is 99.8%, wherein O %=0.0837%, N %=34.025%, C %=0.0249%, S %=0.0024%.

EXAMPLE 12

Various Ratios of Al:AlN Filled in the Hollow Housing without Removing Multi-Layered Structure Example 12 is similar to example 11, besides that the cylinders are not removed after the admixtures are completely filled in the reactant-containing body of example 12 having three cylinders and four divisions. In the large graphite hollow housing, an aluminum plate of 65 cm long, 30 cm wide and 0.5 mm thick is used to form a cylinder of 20 cm in diameter; another aluminum plate of 128 cm long, 30 cm wide and 0.5 mm thick is used to form a cylinder of 40 cm in diameter; and another aluminum plate of 160 cm long, 30 cm wide and 0.5 mm thick is used to form a cylinder of 50 cm in diameter. From the inner to the outer, the admixture (2.9 kg; 0.325 $g/cm^3$) of aluminum:aluminum nitride=8:1 and 1.0% $NaN_3$ by weight is filled in the first division (the most inner part); the admixture (9.0 kg; 0.331 $g/cm^3$) of aluminum:aluminum nitride=6:1 and 1.0% $NaN_3$ by weight is filled in the second division; the admixture (6.5 kg; 0.328 $g/cm^3$) of aluminum:aluminum nitride=4:1 and 1.0% $NaN_3$ by weight is filled in the third division; and the admixture (11.0 kg; 0.326 $g/cm^3$) of aluminum:aluminum nitride=2:1 and 1.0% $NaN_3$ by weight is filled in the fourth division (the most outer part). After the admixtures are completely filled in the reactant-containing body, the cylinders stay for participating the combustion reaction.

The subsequent steps of example 12 are similar to those of example 10, and the reaction takes about 25 minutes 40 seconds in total. After reaction, the products on the top and the perimeter of the reactant-containing body are white-gray; and in loosened form with small thickness. The products in the central area are homogeneous yellow; in loosened and porous form; and frangible. The weight of the products after reaction is about 41.3 kg, and the conversion rate of aluminum to aluminum nitride is 99.9%, wherein O %=0.075%, N %=34.06%, C %=0.0314%, S %=0.0031%.

EXAMPLE 13

Solid Cylinder Made of Fine Al Net and Covered by Admixture

A fine aluminum net (1079 g) of 20 m long, 28 cm wide, 0.25 mm thick and 1 mm pitch is rolled into a solid cylinder of 12 cm in diameter and 27.5 cm high, and is inserted into the small graphite hollow housing as shown in example 1 so as to form a reactant-containing body, wherein the density of the reactant-containing body is 0.3558 $g/cm^3$. Thereafter, the admixture (10 g) of aluminum:aluminum nitride=4:1 and 1.5% $NaN_3$ by weight covers the exterior of the reactant-containing body, and then pure aluminum powder (3 mm thick, 10 g) is paved on the top of the reactant-containing body.

After the reactant-containing body is ready, a preheating device is turned on to keep the temperature of the reaction chamber at about 90° C. to about 400° C. for about 30 to 60 minutes. Thereafter, the preheating device is turned off and a vacuum system is used for vacuuming the reaction chamber. Then, about 1 atm nitrogen gas is introduced into the reaction chamber, and the coolant (water) starts re-circulating between an inner wall and an outer wall of the reaction chamber, wherein the temperature of the coolant is kept at about 50° C. Thereafter, about 2 atm nitrogen gas is introduced into the reactor chamber, and electric current of 30 to 40 Amperes and 50 to 60 Volts is applied to a tungsten filament (heating device) for 1 to 1.5 minutes. As soon as the pure aluminum powder on the top of the reaction-containing body is ignited, the tungsten filament is turned off, and the gas inlets below the base is opened to introduce 120 L/min nitrogen gas flow through the reactant-containing body, wherein the pressure of nitrogen gas is maintained at 2 to 3 atm. When the temperature of the reactant-containing body reaches about 1800 to 2000° C., the gas inlets and the gas outlets are opened for withdrawing the nitrogen gas from the top of the reaction chamber at 25 to 35 L/min. After the nitrogen gas is cooled down, the nitrogen gas is pumped to a nitrogen supply tank, and then outputted back into the reaction chamber with the flow rate increased to 150 L/min. When the temperature of the reactant-containing body reaches 2000° C. without any increase, and the pressure of the reaction chamber reaches 4 atm, the nitrogen gas flow rate is reduced to 30 L/min, thus completing the overall reaction, which takes about 10 minutes 20 seconds in total. Afterwards, the nitrogen gas is kept on re-circulating for 30 to 40 minutes till the temperature of the reactant-containing body reaches about 600° C.

After reaction, the products are yellow; in loosened and porous form; and frangible. The weight of the products after reaction is about 1580 g, and the conversion rate of aluminum to aluminum nitride is 99.2%, wherein O %=0.0553%, N %=33.97%, C %=0.0973%, S %=0.0040%.

EXAMPLE 14

Solid Cylinder Made of Fine Al Net and Covered by Admixture without the Large Graphite Hollow Housing Example 14 is similar to example 13, except that the solid cylinder is not inserted into the large graphite hollow housing. A fine aluminum net (1079 g) of 20 m long, 28 cm wide, 0.25 mm thick and 1 mm pitch is rolled into a solid cylinder of 12 cm in diameter and 27.5 cm high, and is fixed by an aluminum wire to the base of the reaction chamber so as to form a reactant-containing body, wherein the density of the reactant-containing body is 0.3558 $g/cm^3$. Thereafter, the admixture (10 g) of aluminum:aluminum nitride=4:1 and 1.5% $NaN_3$ by weight covers the exterior of the reactant-containing body, and then pure aluminum powder (3 mm thick) is paved on the top of the reactant-containing body.

After the reactant-containing body is ready, a preheating device is turned on to keep the temperature of the reaction chamber at about 90° C. to about 200° C. for about 30 to 60 minutes. Thereafter, the preheating device is turned off and a vacuum system is used for vacuuming the reaction chamber. Then, about 1 atm nitrogen gas is introduced into the reaction chamber, and the coolant (water) starts re-circulating between an inner wall and an outer wall of the reaction chamber, wherein the temperature of the coolant is kept at about 50° C. Thereafter, about 3 atm nitrogen gas is introduced into the reactor chamber, and electric current of 30 to 40 Amperes and 50 to 60 Volts is applied to a tungsten filament (heating device) for I to 1.5 minutes. As soon as the pure aluminum powder on the top of the reaction-containing body is ignited, the tungsten filament is turned off, and the gas inlets below the base is opened to introduce 120 L/min nitrogen gas flow through the reactant-containing body. When the temperature of the reactant-containing body reaches about 1800 to 2000° C., the gas inlets and the gas outlets are opened for withdrawing the nitrogen gas from the top of the reaction chamber at 30 L/min. After the nitrogen gas is cooled down, the nitrogen gas is pumped to a nitrogen supply tank, and then outputted back into the reaction chamber with the flow rate increased to 150 L/min. When the temperature of the reactant-containing body reaches 2000° C. without any increase, and the pressure of the reaction chamber reaches 4 atm, the nitrogen gas flow rate is reduced to 30 L/min, thus completing the overall reaction, which takes about 10 minutes 45 seconds in total. Afterwards, the nitrogen gas is kept on re-circulating for 30 to 40 minutes till the temperature of the reactant-containing body reaches about 600° C.

After reaction, the products are yellow; in loosened and porous form; and frangible. The weight of the products after reaction is about 1543 g, and the conversion rate of aluminum to aluminum nitride is 98.9%, wherein O %=0.0875%, N %=39.8862%, C %=0.0823%, S %=0.0032%.

EXAMPLE 15

Solid Cylinder Made of Coarse Al Net and Covered by Admixture

Example 15 is similar to example 13, except that a coarse aluminum net is used to replace the fine aluminum net. A coarse aluminum net (692 g) of 6 m long, 28 cm wide, 0.7 mm thick and 3 mm pitch is rolled into a solid cylinder of 12 cm in diameter and 28 cm high, and is inserted into the small graphite hollow housing as shown in example 1 so as to form a reactant-containing body, wherein the density of the reactant-containing body is 0.513 g/cm³. Thereafter, the admixture (100 g) of aluminum:aluminum nitride=4:1 and 1.5% NaN₃ by weight covers the exterior of the reactant-containing body, and then pure aluminum powder (3 mm thick) is paved on the top of the reactant-containing body.

After the reactant-containing body is ready, a preheating device is turned on to keep the temperature of the reaction chamber at about 90° C. to about 200° C. for about 30 to 60 minutes. Thereafter, the preheating device is turned off and a vacuum system is used for vacuuming the reaction chamber. Then, about 1 atm nitrogen gas is introduced into the reaction chamber, and the coolant (water) starts re-circulating between an inner wall and an outer wall of the reaction chamber, wherein the temperature of the coolant is kept at about 50° C. Thereafter, about 2 atm nitrogen gas is introduced into the reactor chamber, and electric current is applied to a tungsten filament (heating device) to ignite the pure aluminum powder on the top of the reaction-containing body. Then, the tungsten filament is turned off, and the gas inlets below the base are opened to introduce 120 L/min nitrogen gas flow through the reactant-containing body. When the temperature of the reactant-containing body reaches about 1950° C., the gas inlets and the gas outlets are opened for withdrawing the nitrogen gas from the top of the reaction chamber. When the temperature of the reactant-containing body does not increase, and the pressure of the reaction chamber reaches 4 atm, the overall reaction is completed and takes about 9 minutes 50 seconds in total. Afterwards, the nitrogen gas is kept on re-circulating for 30 minutes and the coolant is kept on re-circulating for 2 hours.

After reaction, the products are yellow; in loosened and porous form; and frangible. The weight of the products after reaction is about 1030 g, and the conversion rate of aluminum to aluminum nitride is 98.2%, wherein O %=0.0879%, N %=33.964%, C %=0.0301%, S %=0.003%.

EXAMPLE 16

Hollow Cylinder Made of Coarse Al Net Paved with Al Foil

An aluminum net of 15 m long, 28 cm wide, 0.25 mm thick and 1 mm pitch paved with aluminum foil (gross weight: 811 g) is rolled into a hollow cylinder of 1.5 cm in inner diameter, 10 cm in outer diameter and 28 cm high, and is inserted into the small graphite hollow housing as shown in example 1 so as to form a reactant-containing body, wherein the density of the reactant-containing body is 0.39 g/cm³. Thereafter, the admixture of aluminum:aluminum nitride=4:1 and 1.5% NaN₃ by weight is filled in the hollow cylinder formed. Between the hollow cylinder formed and the small graphite hollow housing, aluminum nitride is first filled in, and then pure aluminum powder follows, wherein the ratio of aluminum powder to aluminum nitride holds 4:1. Thereafter, pure aluminum powder (3 mm thick) is paved on the top of the reactant-containing body.

After the reactant-containing body is ready, a preheating device is turned on to keep the temperature of the reaction chamber at about 90° C. to about 200° C. for about 30 to 60 minutes. Thereafter, the preheating device is turned off and a vacuum system is used for vacuuming the reaction chamber. Then, about 1 atm nitrogen gas is introduced into the reaction chamber, and the coolant (water) starts re-circulating between an inner wall and an outer wall of the reaction chamber, wherein the temperature of the coolant is kept at about 50° C. Thereafter, about 2 atm nitrogen gas is introduced into the reactor chamber, and electric current is applied to a tungsten filament (heating device) to ignite the pure aluminum powder on the top of the reaction-containing body. Then, the tungsten filament is turned off, and the gas inlets below the base are opened to introduce 120 L/min nitrogen gas flow through the reactant-containing body. When the temperature of the reactant-containing body reaches about 2000° C., the gas inlets and the gas outlets are opened for withdrawing the nitrogen gas from the top of the reaction chamber. When the temperature of the reactant-containing body does not increase, and the pressure of the reaction chamber reaches 4 atm, the overall reaction is completed and takes about 11 minutes in total. Afterwards, the nitrogen gas is kept on re-circulating for 30 minutes and the coolant is kept on re-circulating for 2 hours.

After reaction, the products are yellow; in loosened and porous form; and frangible. The weight of the products after reaction is about 1230 g, and the conversion rate of aluminum to aluminum nitride is 98.6%, wherein O %=0.0792%, N %=33.83%, C %=0.1172%, S %=0.0025%.

EXAMPLE 17

Solid Cylinder Made of Coarse Al Net Paved with Al Foil

An aluminum net of 17 m long, 28 cm wide, 0.25 mm thick and 1 mm pitch paved with aluminum foil (gross weight: 835 g) is rolled into a hollow cylinder of 10 cm in diameter and 28 cm high, and is inserted into the small graphite hollow housing as shown in example 1 so as to form a reactant-containing body, wherein the density of the reactant-containing body is 0.39 g/cm$^3$. The reactant-containing body is placed on a base having been paved with aluminum nitride of 2 to 4 mm in particle size and 1 cm in thickness. Thereafter, aluminum nitride of 0.8 to 1.2 mm in particle size is filled in the gap between the hollow cylinder and the small graphite hollow housing, and the admixture of aluminum:aluminum nitride=4:1 and 1.0% NaN$_3$ by weight covers the reactant-containing body. Then, pure aluminum powder (3 mm thick) is paved on the top of the reactant-containing body.

After the reactant-containing body is ready, a preheating device is turned on to keep the temperature of the reaction chamber at about 90° C. to about 400° C. for about 30 to 60 minutes. Thereafter, the preheating device is turned off and a vacuum system is used for vacuuming the reaction chamber. Then, about 1 atm nitrogen gas is introduced into the reaction chamber, and the coolant (water) starts re-circulating between an inner wall and an outer wall of the reaction chamber, wherein the temperature of the coolant is kept at about 50° C. Thereafter, about 2 atm nitrogen gas is introduced into the reactor chamber, and electric current is applied to a tungsten filament (heating device) to ignite the pure aluminum powder on the top of the reaction-containing body. Then, the tungsten filament is turned off, and the gas inlets below the base are opened to introduce 120 L/min nitrogen gas flow through the reactant-containing body. When the temperature of the reactant-containing body reaches about 1950° C., the gas inlets and the gas outlets are opened for withdrawing the nitrogen gas from the top of the reaction chamber. When the temperature of the reactant-containing body does not increase, and the pressure of the reaction chamber reaches 4 atm, the overall reaction is completed and takes about 11 minutes in total. Afterwards, the nitrogen gas is kept on re-circulating for 35 minutes and the coolant is kept on re-circulating for 2 hours.

After reaction, the products are yellow; in loosened and porous form; and frangible. The weight of the products after reaction is about 1252 g, and the conversion rate of aluminum to aluminum nitride is 98.7%, wherein O %=0.5540%, N %=33.872%, C %=0.8888%, S %=0.0202%.

It is an advantage of the present invention to provide a method and an apparatus for preparing aluminum nitride, wherein nitrogen gas is recycled and cooled down to fully penetrate the reactant admixture via the base having a plurality of through holes, thus saving the production cost and assuring sufficient nitrogen gas can be delivered into the reaction chamber for achieving a complete reaction.

It is another advantage of the present invention to provide a method and an apparatus for preparing aluminum nitride, wherein the application of the multi-layered structure can lower the moisture contained in air, thus simplifying the dehydration treatment of reactant admixture, and can allow the reactant admixture of different compositions to be filled in various areas thereof, thus preventing the product of aluminum nitride being agglomerated, thus benefiting the subsequent grinding process and assuring the quality of aluminum nitride.

It is another advantage of the present invention to provide a method and an apparatus for preparing aluminum nitride, wherein the reactant admixture of different compositions can be filled in the multi-layered structure during various stages of the combustion process, thus maintaining the optimum combustion state and achieving a complete reaction.

It is another advantage of the present invention to provide an apparatus for preparing aluminum nitride, wherein coolant is re-circulated between the inner and outer walls of the reaction chamber, thus prolonging the life of the reaction chamber.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A method for preparing aluminum nitride comprising:
    preparing a reactant-containing body filled with admixtures of aluminum powder, a diluent and nitrogen-containing solid compound, said reactant-containing body having a crucible;
    placing said crucible of said reactant-containing body on a base in a reaction chamber;
    preheating said reactant-containing body to a predetermined temperature for a predetermined period of time;
    vacuuming said reaction chamber;
    introducing a re-circulating nitrogen gas through said reactant-containing body in said reaction chamber;
    re-circulating a coolant between an inner wall and an outer wall of said reaction chamber; and
    igniting a ignition portion to perform a combustion synthesis process, thereby preparing the aluminum nitride.

2. The method for preparing aluminum nitride according to claim 1, wherein said reactant-containing body has:
    said ignition portion located at the topmost of said reactant-containing body;
    a propagating portion located next to said ignition portion;
    a sustaining portion located next to said propagating portion; and
    an ending portion located next to said sustaining portion, wherein pure aluminum fine powder is filled in said ignition portion; a higher weight ratio of aluminum powder to said diluent is filled in said propagating portion; a medium weight ratio of aluminum powder to said diluent is filled in said sustaining portion; and a lower weight ratio of aluminum powder to said diluent is filled in said ending portion.

3. The method for preparing aluminum nitride according to claim 2, wherein said reactant-containing body further comprises a multi-layered structure.

4. The method for preparing aluminum nitride according to claim 3, wherein said multi-layered structure is formed by a plurality of shapes selected from a group consisting of cylinders and polygonal prisms.

5. The method for preparing aluminum nitride according to claim 3, wherein said multi-layered structure is made of an one-piece element rolled in a helical form, and the outer end of said helical form is sealed as a closed end.

6. The method for preparing aluminum nitride according to claim 3, wherein said multi-layered structure is formed by a material selected from a group consisting of aluminum net, aluminum sheet and aluminum foil.

7. The method for preparing aluminum nitride according to claim 3, wherein said multi-layered structure is removed after said admixtures are completely filled in said reactant-containing body.

8. The method for preparing aluminum nitride according to claim 2, wherein said reactant-containing body further comprises a hollow housing fixed on said crucible, and said multi-layered structure placed in said hollow housing, and said propagating portion, said sustaining portion and said ending portion are distributed diametrically from the center of said reactant-containing body.

9. The method for preparing aluminum nitride according to claim 2, wherein said reactant-containing body further comprises a hollow housing fixed on said crucible, and said propagating portion, said sustaining portion and said ending portion are distributed vertically from the top to the bottom of said hollow housing.

10. The method for preparing aluminum nitride according to claim 2, wherein, the weight ratio of aluminum powder to said diluent filled in said propagating portion is between about 6:1 to about 12:1; the weight ratio of aluminum powder to said diluent filled in said sustaining portion is between about 2:1 to about 6:1; and the weight ratio of aluminum powder to said diluent filled in said ending portion is between about 1:1 to about 4:1.

11. The method for preparing aluminum nitride according to claim 1, wherein said nitrogen-containing solid compound is selected from a group consisting of sodium nitride ($NaN_3$) powder, potassium nitride ($KN_3$) and barium nitride ($Ba_3N_2$).

12. The method for preparing aluminum nitride according to claim 1, wherein said nitrogen-containing solid compound is less than or equal to 10%.

13. The method for preparing aluminum nitride according to claim 1, comprising cooling said re-circulating nitrogen gas during said combustion synthesis process.

14. The method for preparing aluminum nitride according to claim 1, wherein said predetermined temperature is between about 90° C. and about 400° C.

15. The method for preparing aluminum nitride according to claim 1, wherein said predetermined period of time is between about 30 minutes and about 90 minutes.

16. The method for preparing aluminum nitride according to claim 1, wherein said diluent is selected from a group consisting of AlN, $Al_2O_3$, BN, $Si_3N_4$, TiN, SiC, $ZrO_2$, $TiO_2$ and $SiO_2$.

17. A method for preparing aluminum nitride comprising:
preparing a reactant-containing body filled with admixtures of aluminum powder, a diluent and nitrogen-containing solid compound, wherein said reactant-containing body has:
an ignition portion located at the topmost of said reactant-containing body;
an upper layer located next to said ignition portion;
an middle layer located next to said upper layer; and
a lower layer located next to said middle layer, each of said upper layer, said middle layer and said lower layer having a propagating portion located in the center, a sustaining portion located next to said propagating portion, and an ending portion located next to said sustaining portion, wherein pure aluminum fine powder is filled in said ignition portion, and the weight ratio of aluminum powder to said diluent filled in said propagating portion of said upper layer is lowered than the weight ratio of aluminum powder to said diluent filled in the ignition portion; and the weight ratios of aluminum powder to aluminum nitride filled in said propagating portion of said middle layer and said lower layer are decreased sequentially; and for each of said upper layer, said middle layer and said lower layer, the weight ratios of aluminum powder to aluminum nitride filled in said propagating portion, said sustaining portion and said ending portion are decreased sequentially;
placing a crucible of said reactant-containing body on a base in a reaction chamber;
preheating said reactant-containing body to a predetermined temperature for a predetermined period of time;
vacuuming said reaction chamber;
introducing a re-circulating nitrogen gas through said reactant-containing body in said reaction chamber;
re-circulating a coolant between an inner wall and an outer wall of said reaction chamber; and
igniting said ignition portion to perform a combustion synthesis process, thereby preparing the aluminum nitride.

18. The method for preparing aluminum nitride according to claim 17, wherein said nitrogen-containing solid compound is selected from a group consisting of sodium nitride ($NaN_3$) powder, potassium nitride ($KN_3$) and barium nitride ($Ba_3N_2$).

19. The method for preparing aluminum nitride according to claim 17, wherein said nitrogen-containing solid compound is less than or equal to 10%.

20. The method for preparing aluminum nitride according to claim 17, comprising cooling said re-circulating nitrogen gas during said combustion synthesis process.

21. The method for preparing aluminum nitride according to claim 17, wherein said predetermined temperature is between about 90° C. and about 400° C.

22. The method for preparing aluminum nitride according to claim 17, wherein said predetermined period of time is between about 30 minutes and about 90 minutes.

23. The method for preparing aluminum nitride according to claim 17, wherein said diluent is selected from a group consisting of AlN, $Al_2O_3$, BN, $Si_3N_4$, TiN, SiC, $ZrO_2$, $TiO_2$ and $SiO_2$.

* * * * *

UNITED STATES PATENT AND TRADEMARK OFFICE
CERTIFICATE OF CORRECTION

PATENT NO. : 7,011,804 B2  Page 1 of 2
APPLICATION NO. : 10/612530
DATED : March 14, 2006
INVENTOR(S) : Chung-Hong Lau et al.

It is certified that error appears in the above-identified patent and that said Letters Patent is hereby corrected as shown below:

On Title Page, Item (56) 2$^{nd}$ column under Other Publications, on line 1, delete "(AI+AIN)" and insert --(A1+A1N)--, therefore;

On Title Page Item 57 2$^{nd}$ column in the Abstract, at line 16, after the word nitride delete ", thereby preparing the aluminum nitride", therefore;

On Title Page, pg. 2 Item 56 2$^{nd}$ column under Other Publications, on line 2, delete the word "Nitrogrn" and insert --Nitrogen--, therefore;

In column 2, line 18 delete "raised" and insert --fused--, therefore;

In column 3, line 39 delete "Teactant" and insert --reactant--, therefore;

In column 6, line 23 delete "D)" and insert --(D)--, therefore;

In column 9, line 54 delete "reactant containing" and insert --reactant-containing--, therefore;

In column 14, line 4 delete "(10g)" and insert --(100g)--, therefore;

In column 14, line 7 delete "10g)" and insert --100g)--, therefore;

UNITED STATES PATENT AND TRADEMARK OFFICE
CERTIFICATE OF CORRECTION

PATENT NO. : 7,011,804 B2
APPLICATION NO. : 10/612530
DATED : March 14, 2006
INVENTOR(S) : Chung-Hong Lau et al.

It is certified that error appears in the above-identified patent and that said Letters Patent is hereby corrected as shown below:

In column 14, line 62 delete "(10g)" and insert --(100g)--, therefore;

In column 15, line 11 delete "I" and insert --1--, therefore;

Signed and Sealed this

Twenty-eighth Day of November, 2006

JON W. DUDAS
*Director of the United States Patent and Trademark Office*